(12) United States Patent
Zhang

(10) Patent No.: US 12,211,893 B2
(45) Date of Patent: Jan. 28, 2025

(54) SEMICONDUCTOR STRUCTURE AND MANUFACTURING METHOD THEREOF

(71) Applicant: CHANGXIN MEMORY TECHNOLOGIES, INC., Hefei (CN)

(72) Inventor: Kui Zhang, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 348 days.

(21) Appl. No.: 17/662,472

(22) Filed: May 9, 2022

(65) Prior Publication Data

US 2023/0223429 A1 Jul. 13, 2023

Related U.S. Application Data

(63) Continuation of application No. PCT/CN2022/080230, filed on Mar. 10, 2022.

(30) Foreign Application Priority Data

Jan. 13, 2022 (CN) .......................... 202210038475.4

(51) Int. Cl.
*H10B 12/00* (2023.01)
*H01L 21/768* (2006.01)
*H01L 49/02* (2006.01)

(52) U.S. Cl.
CPC .......... *H01L 28/91* (2013.01); *H01L 21/7682* (2013.01); *H01L 28/90* (2013.01); *H01L 28/92* (2013.01); *H10B 12/033* (2023.02); *H10B 12/315* (2023.02); *H10B 12/318* (2023.02)

(58) Field of Classification Search
CPC .. H10B 12/033; H10B 12/315; H10B 12/318; H01L 28/90–92; H01L 28/7682
See application file for complete search history.

(56) References Cited

U.S. PATENT DOCUMENTS

| 8,372,724 B2 | 2/2013 | Takaishi |
| 2009/0061589 A1 | 3/2009 | Maekawa et al. |
| 2010/0237466 A1* | 9/2010 | Kim ..................... H10B 12/033 257/532 |

(Continued)

FOREIGN PATENT DOCUMENTS

| CN | 107731794 A | 2/2018 |
| CN | 110504283 A | 11/2019 |
| CN | 110504284 A | 11/2019 |

OTHER PUBLICATIONS

International Search Report cited in PCT/CN2022/080230 mailed Sep. 26, 2022, 8 pages.

*Primary Examiner* — Jose R Diaz
(74) *Attorney, Agent, or Firm* — Syncoda LLC; Feng Ma

(57) ABSTRACT

The present disclosure relates to the technical field of semiconductors, and provides a semiconductor structure and a manufacturing method thereof. The semiconductor structure includes: a substrate, including a plurality of lower electrode pillars that are arranged at intervals; a dielectric layer, at least partially covering a sidewall of each of the lower electrode pillars; a first upper electrode, covering a surface of the dielectric layer; a first support layer, located above the plurality of lower electrode pillars, the dielectric layer, and the first upper electrode, wherein the first support layer at least exposes a peripheral region of a part of the first upper electrode.

15 Claims, 12 Drawing Sheets

(56) References Cited

U.S. PATENT DOCUMENTS

2010/0314715 A1    12/2010   Fujimoto
2014/0361403 A1*   12/2014   Cho ........................ H01L 28/90
                                                                                      257/532
2020/0006345 A1     1/2020   Choo et al.
2020/0312948 A1    10/2020   Kim

* cited by examiner

SEMICONDUCTOR STRUCTURE AND MANUFACTURING METHOD THEREOF

CROSS-REFERENCE TO RELATED APPLICATIONS

This is a continuation of International Application No. PCT/CN2022/080230, filed on Mar. 10, 2022, which claims the priority to Chinese Patent Application 202210038475.4, titled "SEMICONDUCTOR STRUCTURE AND MANUFACTURING METHOD THEREOF" and filed on Jan. 13, 2022. The entire contents of International Application No. PCT/CN2022/080230 and Chinese Patent Application 202210038475.4 are incorporated herein by reference.

TECHNICAL FIELD

The present disclosure relates to the technical field of semiconductors, and in particular to a semiconductor structure and a manufacturing method thereof.

BACKGROUND

In the related art, with the miniaturization of the semiconductor structure, capacitors need to meet higher requirements. In order to ensure sufficient storage capacity, it is necessary to make the capacitors high enough, making the capacitors prone to tipping.

SUMMARY

According to a first aspect of the present disclosure, a semiconductor structure is provided, including:
  a substrate, including a plurality of lower electrode pillars arranged at intervals;
  a dielectric layer, at least partially covering a sidewall of each of the lower electrode pillars;
  a first upper electrode, covering a surface of the dielectric layer; and
  a first support layer, located above the plurality of lower electrode pillars, the dielectric layer, and the first upper electrode, wherein the first support layer at least exposes a peripheral region of a part of the first upper electrode.

According to a second aspect of the present disclosure, a method of manufacturing a semiconductor structure is provided, including:
  providing a substrate, and forming a plurality of lower electrode pillars arranged at intervals on the substrate;
  forming a dielectric layer and a first upper electrode among the plurality of lower electrode pillars, wherein the dielectric layer at least partially covers a sidewall of each of the lower electrode pillars, and the first upper electrode covers a surface of the dielectric layer; and
  forming a first initial support layer above the plurality of lower electrode pillars, the dielectric layer, and the first upper electrode, and removing a part of the first initial support layer to form a first support layer;
  wherein the first support layer at least exposes a peripheral region of a part of the first upper electrode.

BRIEF DESCRIPTION OF THE DRAWINGS

The preferred implementations of the present disclosure are described in detail below with reference to the accompanying drawings to make the objectives, features and advantages of the present disclosure more obvious. The accompanying drawings are merely exemplary illustrations of the present disclosure, and are not necessarily drawn to scale. The same reference numerals in the accompanying drawings always represent the same parts. In the drawings.

DETAILED DESCRIPTION

Figure 1:
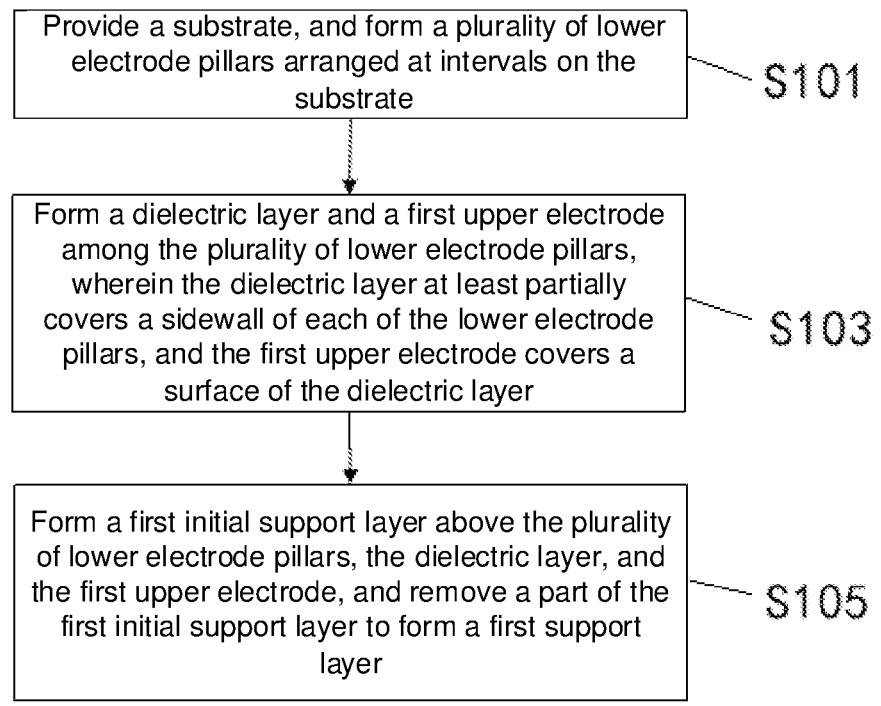
FIG. 1 is a schematic flowchart of a method of manufacturing a semiconductor structure according to an exemplary implementation.

The typical embodiments embodying the features and advantages of the present disclosure are described in detail below. It should be understood that the present disclosure may have various changes in different embodiments, which do not depart from the scope of the present disclosure. The description and accompanying drawings herein are essentially used for the purpose of explanation, rather than limiting the present disclosure.

Different exemplary embodiments of the present disclosure are described below with reference to the accompanying drawings. The accompanying drawings form a part of the present disclosure, which show by way of example different exemplary structures, systems and steps that can implement various aspects of the present disclosure. It should be understood that other specific solutions of components, structures, exemplary devices, systems and steps may be used, and structural and functional modifications may be made without departing from the scope of the present disclosure. Moreover, although the terms such as "above", "between" and "within" may be used in this specification to describe different exemplary features and elements of the present disclosure, these terms are used herein only for convenience of description, for example, according to the directions of the examples in the drawings. Nothing in this specification should be understood as requiring a specific three-dimensional direction of the structure to fall within the scope of the present disclosure.

An embodiment of the present disclosure provides a method of manufacturing a semiconductor structure. With reference to FIG. 1 to FIG. 23, the method of manufacturing a semiconductor structure includes:

S101: Provide a substrate 10, and form a plurality of lower electrode pillars 20 arranged at intervals on the substrate 10.

S103: Form a dielectric layer 40 and a first upper electrode 51 between the plurality of lower electrode pillars 20, wherein the dielectric layer 40 at least partially covers a sidewall of each of the lower electrode pillars 20, and the first upper electrode 51 covers a surface of the dielectric layer 40.

S105: Form a first initial support layer 311 above the plurality of lower electrode pillars 20, the dielectric layer 40, and the first upper electrode 51, and remove a part of the first initial support layer 311 to form a first support layer 31, wherein the first support layer 31 at least exposes a peripheral region of a part of the first upper electrode 51.

In the method of manufacturing a semiconductor structure according to an embodiment of the present disclosure, the lower electrode pillars 20, the dielectric layer 40, and the first upper electrode 51 are formed on the substrate 10. The first support layer 31 is formed above the lower electrode pillars 20, and the first support layer 31 can connect the plurality of lower electrode pillars 20, the dielectric layer 40, and the first upper electrode 51, so that the first support layer 31 can support the plurality of lower electrode pillars 20 to prevent the lower electrode pillars 20 from tipping, thereby ensuring the quality of the lower electrode pillars 20 and improving the performance of the semiconductor structure.

It should be noted that, the plurality of lower electrode pillars 20 are formed on the substrate 10 independently. In order to ensure the working performance of the semiconductor structure and ensure the miniaturization of the semiconductor structure, the heights of the lower electrode pillars 20 are increased. The relatively high lower electrode pillars 20 are prone to tipping, affecting the product yield. In this embodiment, by forming the first support layer 31 on the top of the lower electrode pillars 20, the first support layer 31 can connect the plurality of lower electrode pillars 20, so that the plurality of lower electrode pillars 20 independently formed on the substrate 10 are supported by the substrate 10 and the first support layer 31, thereby preventing the lower electrode pillars 20 from tipping.

In an embodiment, the first support layer 31 may be of an integral structure, so as to connect all the lower electrode pillars 20, thereby ensuring a reliable support effect. In an embodiment, a plurality of first support layers 31 may be provided. Each first support layer 31 may connect at least two lower electrode pillars 20, which can also ensure a reliable support effect.

In an embodiment, the forming a plurality of lower electrode pillars 20 arranged at intervals on the substrate 10 includes: forming a laminated structure on the substrate 10; forming a plurality of through holes 12 in the laminated structure, wherein the through holes 12 penetrate the laminated structure to expose a surface of the substrate 10; filling a first conductive material 21 in the through holes 12 to form initial lower electrode pillars, removing the laminated structure, and forming an initial dielectric layer and a first initial upper electrode on upper surfaces of the initial lower electrode pillars; removing a part of each initial lower electrode pillar, a part of the initial dielectric layer, and a part of the first initial upper electrode, and forming the lower electrode pillars 20, the dielectric layer 40, and the first upper electrode 51 whose top portions are flush with each other.

In an embodiment, the forming a plurality of lower electrode pillars 20 on the substrate 10 includes: forming a laminated structure on the substrate 10; forming a plurality of through holes 12 in the laminated structure, wherein the through holes 12 penetrate the laminated structure to expose contact pads 11 on the substrate 10; and depositing a first conductive material in the through holes 12 and on the laminated structure, so that the first conductive material is used to form the lower electrode pillars 20.

In an embodiment, the method of manufacturing a semiconductor structure further includes: forming a plurality of contact pads 11 arranged at intervals on the substrate 10, wherein the lower electrode pillars 20 and the contact pads 11 may be integrally connected one to one; and forming an isolation structure 14 between the plurality of contact pads 11, wherein the dielectric layer 40 further covers an upper surface of the isolation structure 14.

Figure 2:
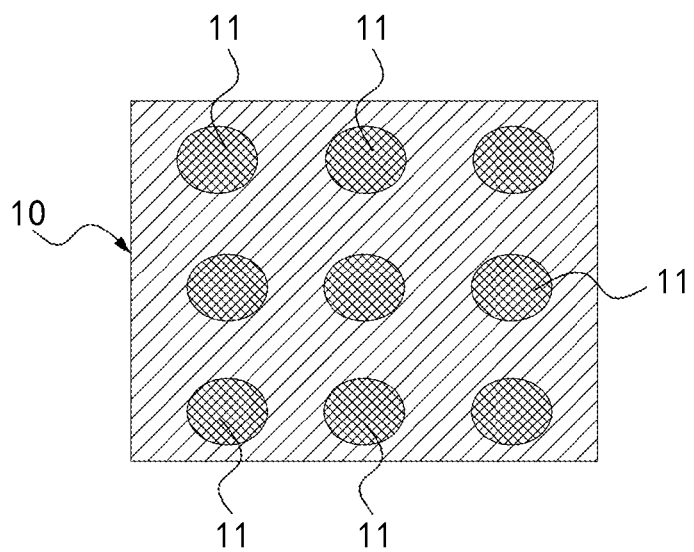
FIG. 2 is a top view of forming contact pads in a method of manufacturing a semiconductor structure according to an exemplary implementation.
Figure 3:
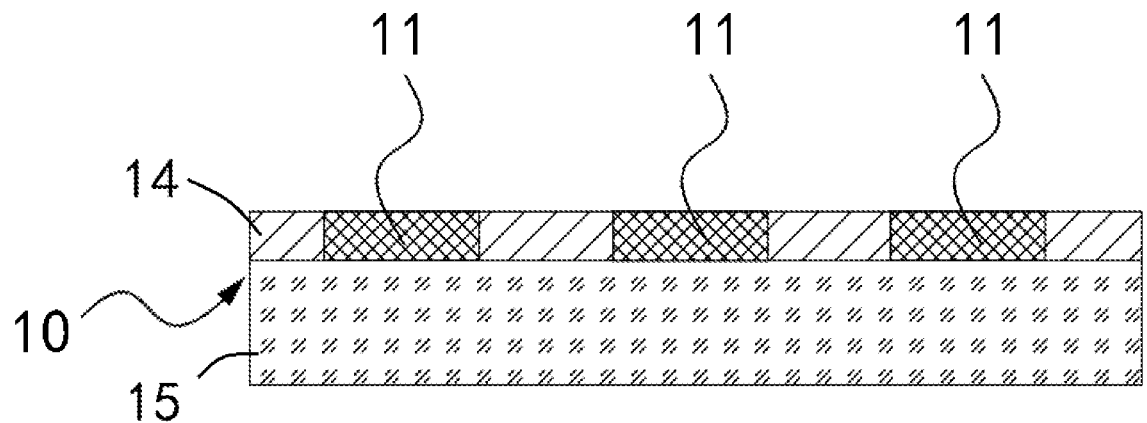
FIG. 3 is a cross-sectional schematic structural diagram of forming contact pads in a method of manufacturing a semiconductor structure according to an exemplary implementation.

With reference to FIG. 2 and FIG. 3, the substrate 10 may include a base 15 and an isolation structure 14. The contact pads 11 are formed in the isolation structure 14. The base 15 may include electronic devices therein, and the contact pads 11 may be connected to corresponding electronic devices respectively. A plurality of contact pads 11 may be independently formed in the isolation structure 14.

The base 15 may include a portion made of a silicon-containing material. The base 15 may be made of any suitable material, including, for example, at least one from the group consisting of silicon, monocrystalline silicon, polysilicon, amorphous silicon, silicon-germanium, monocrystalline silicon-germanium, polycrystalline silicon-germanium, or carbon-doped silicon. The isolation structure 14 may include silicon nitride (SiN), silicon oxynitride (SiON), silicon carbon nitride (SiCN) or the like.

The laminated structure is formed on the isolation structure 14. A forming process of the through holes 12 is not limited herein, which may be a process in the related art. Bottoms of the through holes 12 expose the contact pads 11 respectively. In this embodiment, the through holes 12 may be capacitor holes.

In an embodiment, the forming a plurality of through holes 12 in the laminated structure includes: the laminated structure comprising a sacrificial layer and a second initial support layer stacked in turn; forming a mask layer with a mask pattern on the laminated structure, wherein the mask pattern at least exposes a part of the second initial support layer 321; removing the sacrificial layer 13 and a part of the second initial support layer 321 by using the mask pattern, to expose a partial sidewall of each lower electrode pillar 20 and a partial surface of the substrate 10; and forming the plurality of through holes 12 penetrating the laminated structure.

In an embodiment, the mask layer is formed above the first conductive material 21. The mask layer includes a plurality of first etching holes. The first etching holes are located in a region defined by at least four through holes 12. The laminated structure and the first conductive material 21 are etched by using the mask layer as a mask, and forming a plurality of lower electrode pillars 20. The plurality of lower electrode pillars 20 are independently formed in the through holes 12.

In an embodiment, a total area of a cross section of an upper portion of the initial lower electrode pillar and a cross section of a second support layer 32 is larger than an area of a cross section of a lower portion of the initial lower electrode pillar.

In an embodiment, a remaining part of second initial support layer 321 forms the second support layer 32 on a partial sidewall of the upper portion of the initial lower electrode pillar, so that the second support layer 32 can reliably support the lower electrode pillar 20.

The laminated structure includes the sacrificial layer 13 and the second initial support layer 321 that are sequentially formed on the substrate 10. The etching the laminated structure and the first conductive material 21 by using the mask layer as a mask includes: removing the sacrificial layer 13, a part of the second initial support layer 321, and the first conductive material 21 exposed in the first etching holes, to form the second support layer 32 and the initial lower electrode pillars, that is, the second support layer 32 can cover sidewalls of the initial lower electrode pillars, to protect and support the initial lower electrode pillars.

It should be noted that, the initial lower electrode pillars are processed subsequently, to form a plurality of independent lower electrode pillars 20. The sacrificial layer 13 and the second initial support layer 321 can ensure reliable forming of the lower electrode pillars 20, so that after a plurality of independent lower electrode pillars 20 are formed, the first support layer 31 and the second support layer 32 can support the plurality of lower electrode pillars 20 and prevent the lower electrode pillars 20 from tipping, especially the lower electrode pillars at the edge.

In an embodiment, upper portions of the through holes 12 are formed in the second support layer 32, and the second support layer 32 covers sidewalls of the upper portions of the lower electrode pillars 20. The first support layer 31 is formed above the second support layer 32.

Figure 4:
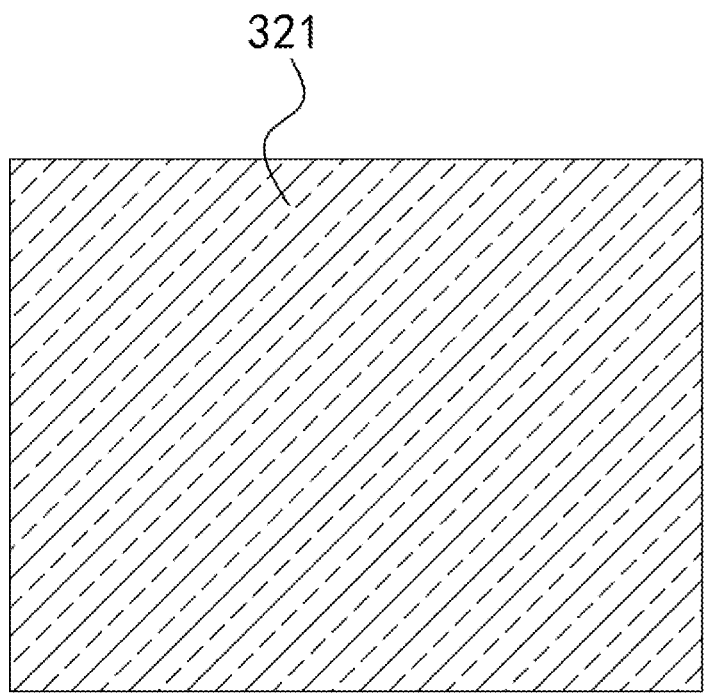
FIG. 4 is a top view of forming a laminated structure in a method of manufacturing a semiconductor structure according to an exemplary implementation.
Figure 5:
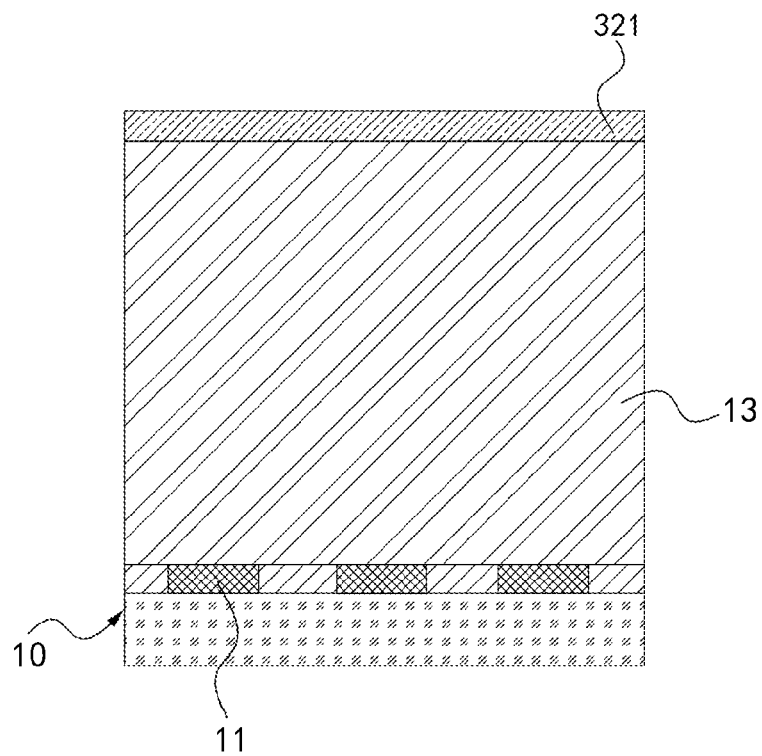
FIG. 5 is a cross-sectional schematic structural diagram of forming a laminated structure in a method of manufacturing a semiconductor structure according to an exemplary implementation.

With reference to FIG. 4 and FIG. 5, the sacrificial layer 13 is formed on the substrate 10, and the second initial support layer 321 is formed on the sacrificial layer 13. A thickness of the sacrificial layer 13 is specified according to process requirements. The second initial support layer 321 can achieve a protection and support function. The sacrificial layer 13 and the second initial support layer 321 may be formed through a physical vapor deposition process, a chemical vapor deposition process, or an atomic layer deposition process.

In an embodiment, the second initial support layer 321 may be made of silicon nitride (SiN), silicon oxynitride (SiON), silicon carbon nitride (SiCN) or the like. The first support layer 31 may be made of silicon nitride (SiN), silicon oxynitride (SiON), silicon carbon nitride (SiCN) or the like.

Figure 6:
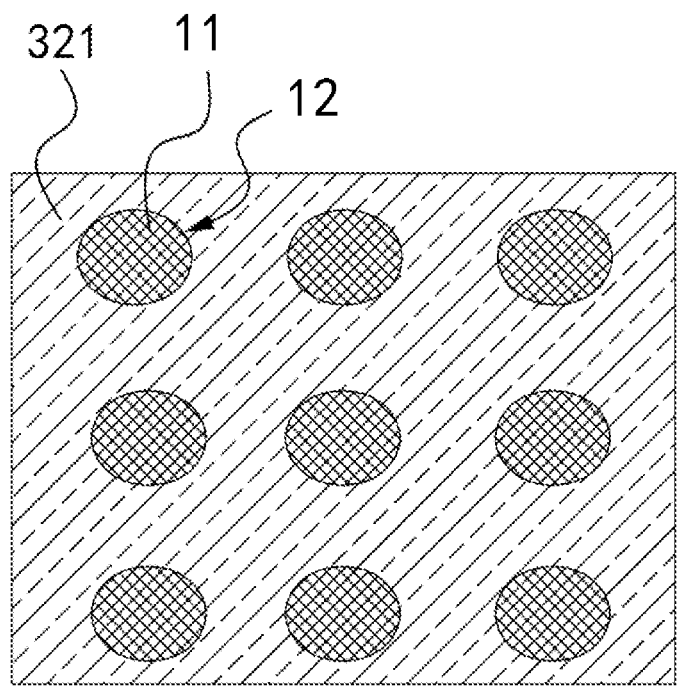
FIG. 6 is a top view of forming through holes in a method of manufacturing a semiconductor structure according to an exemplary implementation.
Figure 7:
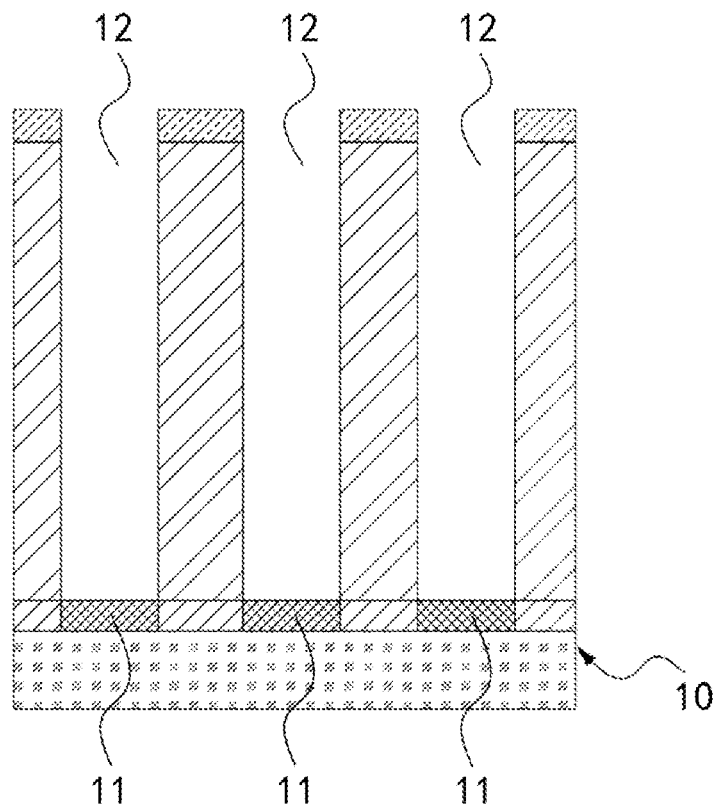
FIG. 7 is a cross-sectional schematic structural diagram of forming through holes in a method of manufacturing a semiconductor structure according to an exemplary implementation.

As shown in FIG. 6 and FIG. 7, after the sacrificial layer 13 and the second initial support layer 321 are formed on the substrate 10, the through holes 12 are formed in the laminated structure. In this case, each through hole 12 exposes a contact pad 11. The plurality of through holes 12 expose the plurality of contact pads 11 respectively. A material of the contact pads 11 includes, but is not limited to, tungsten (W).

Figure 8:
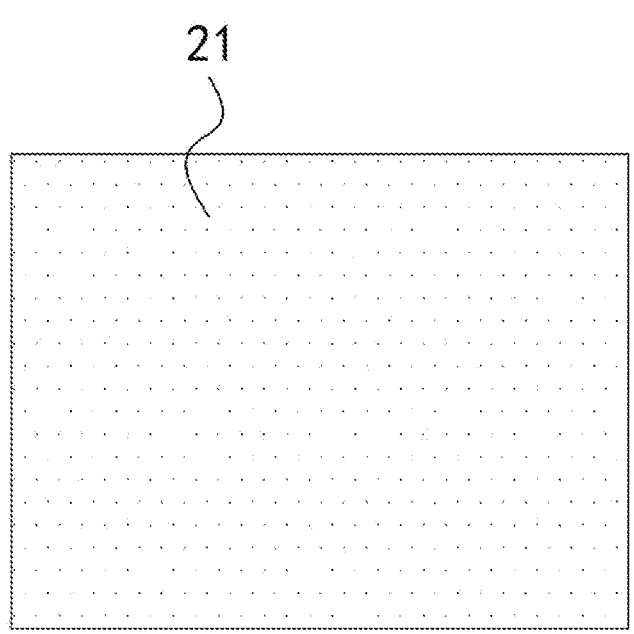
FIG. 8 is a top view of forming a first conductive material in a method of manufacturing a semiconductor structure according to an exemplary implementation.
Figure 9:
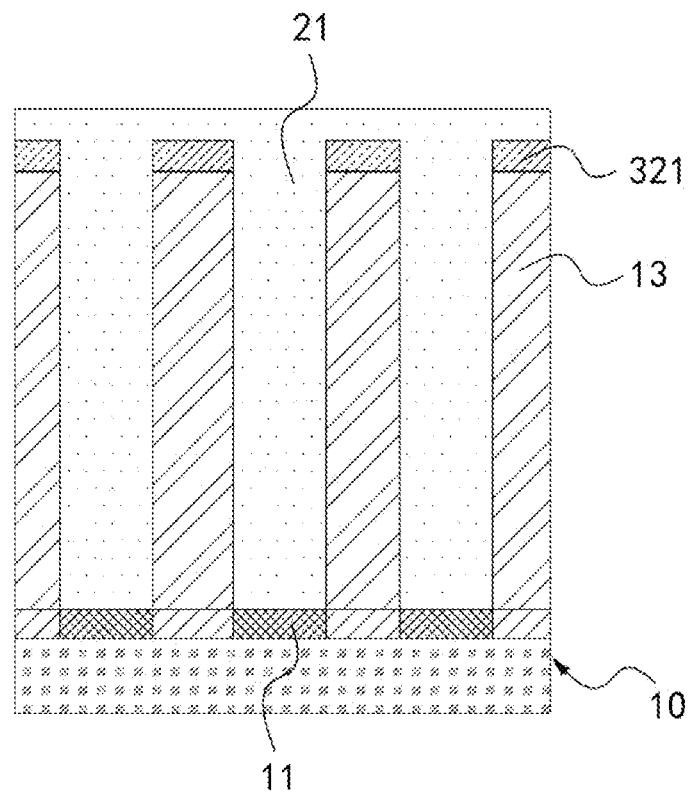
FIG. 9 is a cross-sectional schematic structural diagram of forming a first conductive material in a method of manufacturing a semiconductor structure according to an exemplary implementation.

The lower electrode pillar 20 is formed in each through hole 12. In this case, the first conductive material 21 is formed in each through hole 12. The first conductive material 21 is a metal material. The first conductive material 21 is not only filled in the through holes 12, but also covers an upper end of the second initial support layer 321, as shown in FIG. 8 and FIG. 9. The first conductive material 21 is formed in the through holes 12 through deposition. The first conductive material 21 may be formed by using a physical vapor deposition process, a chemical vapor deposition process, or an atomic layer deposition process, which is not limited herein.

In an embodiment, the first conductive material 21 of the lower electrode pillars 20 may include one or more metal materials from a group consisting of titanium, titanium nitride, platinum, and the like, which is not limited herein. In this embodiment, a material of the lower electrode pillars 20 includes, but is not limited to, titanium nitride.

In an embodiment, the first conductive material 21 is filled in the through holes 12, and the first conductive material 21 covers an upper surface of the second support layer 32. That is, after the through holes 12 are formed, the first conductive material 21 is deposited, so that the first conductive material 21 is filled in the through holes 12 and covers the upper surface of the second support layer 32, as shown in FIG. 8 and FIG. 9.

Before the dielectric layer 40 is formed, the sacrificial layer 13 is removed. That is, a gap is formed between the second initial support layer 321 and each lower electrode pillar 20, to allow subsequently forming of the dielectric layer 40 and the first upper electrode 51.

In an embodiment, before the sacrificial layer 13 is removed, a plurality of openings 1 are formed in the second support layer 32 and the first conductive material 21, to expose the sacrificial layer 13. That is, a mask layer is formed above the first conductive material. The mask layer includes a plurality of first etching holes, which are located in a region defined by at least four through holes 12. The laminated structure and the first conductive material are etched by using the mask layer as a mask. In a direction parallel to the substrate 10, a width of each opening 1 is less than a distance between two adjacent through holes 12, so that in the direction parallel to the substrate 10, a width of the first conductive material 21 in the through hole 12 is greater than a width of the first conductive material 21 on the upper surface of the second support layer 32, to provide reliable support for subsequent forming of the dielectric layer 40.

Figure 10:
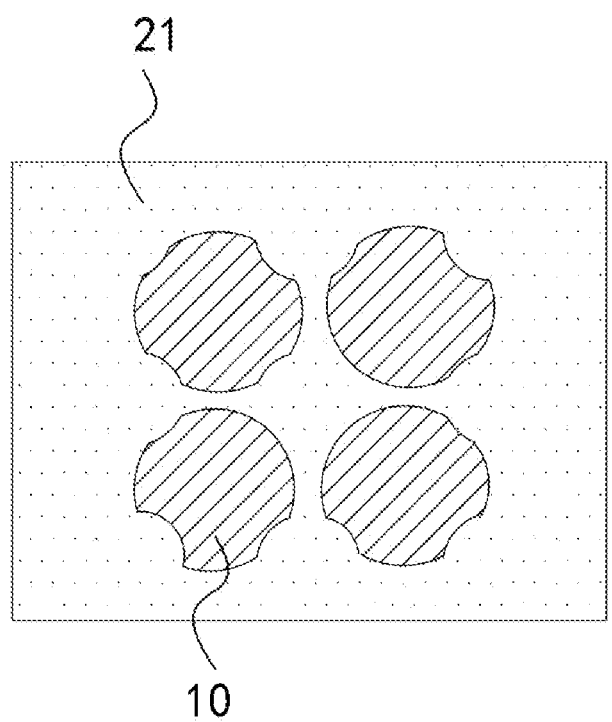
FIG. 10 is a top view after removal of a sacrificial layer in a method of manufacturing a semiconductor structure according to an exemplary implementation.
Figure 11:
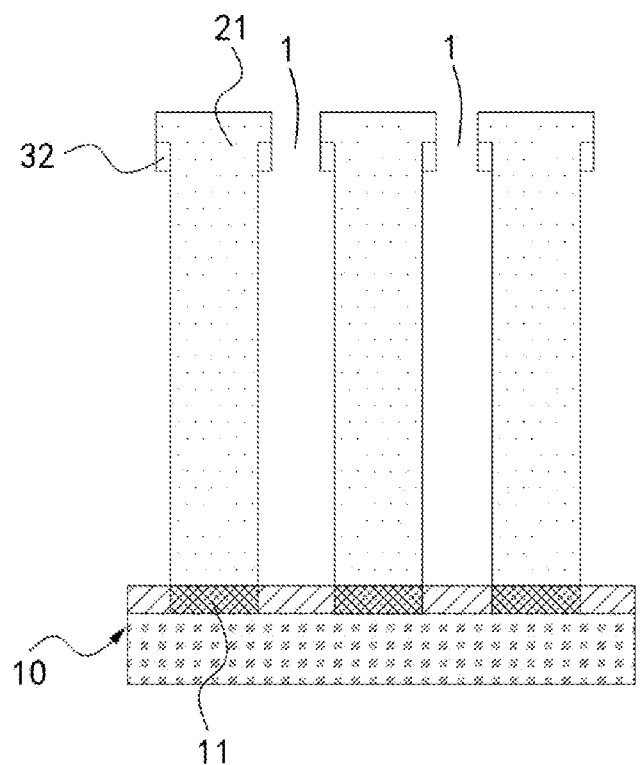
FIG. 11 is a cross-sectional schematic structural diagram after removal of a sacrificial layer in a method of manufacturing a semiconductor structure according to an exemplary implementation.

After the openings 1 are formed, the sacrificial layer 13 is removed to form the structure shown in FIG. 10 and FIG. 11, to expose the substrate 10. In this case, the first conductive material 21 above the second support layer 32 is still of an integral structure. Therefore, after the first conductive material 21 above the second support layer 32 is removed subsequently, the remaining first conductive material 21 is used as a plurality of independent lower electrode pillars 20. Alternatively, after the first conductive material 21 that is located above the second support layer 32 and in the second support layer 32 is removed, the remaining first conductive material 21 is used as a plurality of independent lower electrode pillars 20.

In an embodiment, a total area of a cross section of an upper portion of the initial lower electrode pillar and a cross section of the second support layer 32 is larger than an area of a cross section of a lower portion of the initial lower electrode pillar. The second support layer 32 can protect the upper portion of the initial lower electrode pillar.

In an embodiment, the laminated structure includes a sacrificial layer 13 and a second initial support layer 321 that are sequentially formed on the substrate 10. The etching the laminated structure and the first conductive material by using the mask layer as a mask includes: removing the sacrificial layer 13, the second initial support layer 321, and the first conductive material exposed in the first etching holes, to form initial lower electrode pillars. That is, the laminated structure is entirely removed, so that upper portions and lower portions of the subsequently formed independent lower electrode is pillars 20 can directly cover the dielectric layer 40.

It should be noted that, after the openings 1 are formed through the mask layer, the sacrificial layer 13 and the second initial support layer 321 can be completely removed through the openings 1, thereby completely removing the laminated structure.

In an embodiment, an isolation structure 14 is formed between the contact pads 11 on the substrate 10. After the initial lower electrode pillars are formed, the dielectric layer 40 is deposited, wherein the dielectric layer 40 covers the initial lower electrode pillars and the isolation structure 14. A second conductive material is deposited above the dielectric layer 40, wherein a top surface of the second conductive material is higher than a top surface of the dielectric layer 40. The second conductive material, the dielectric layer, and the first conductive material that are higher than top surfaces of the through holes 12 are removed, to form the lower electrode pillars 20.

It should be noted that, an extension direction of the through hole 12 is perpendicular to the substrate 10, and the through hole 12 is formed in the laminated structure. Therefore, the top surface of the through hole 12 is the upper surface of the laminated structure.

In some embodiments, the laminated structure and the first conductive material are etched by using the mask layer as a mask. During forming of the second support layer 32 and the initial lower electrode pillars, after the second conductive material, the dielectric layer 40, and the first conductive material that are higher than the top surfaces of the through holes 12 are removed, the upper portions of the formed lower electrode pillars 20 are covered by the second support layer 32.

In an embodiment, the removing a part of each initial lower electrode pillar, a part of the initial dielectric layer, and a part of the first initial upper electrode to form the lower electrode pillars 20, the dielectric layer 40, and the first upper electrode 51 whose top portions are flush with each other includes: removing portions of each initial lower electrode pillar, the initial dielectric layer, and the first initial upper electrode that are higher than the second support layer 32, to form the lower electrode pillars 20, the dielectric layer 40, and the first upper electrode 51 that are flush with a top portion of the second support layer 32, so that the first support layer 31 can reliably cover the lower electrode pillars 20, the dielectric layer 40, and a part of the first upper electrode 51, to achieve a fastening function.

In an embodiment, the first support layer 31 is connected to the second support layer 32. That is, after the lower electrode pillars 20 are formed, the first support layer 31 can be formed on the top of each lower electrode pillar 20, and the first support layer 31 is connected to the second support layer 32, so that the first support layer 31 and the second support layer 32 jointly protect the lower electrode pillars 20.

In some embodiments, when the laminated structure and the first conductive material are removed by using the mask layer as a mask and the second initial support layer 321 is completely removed to form the initial lower electrode pillars, after the second conductive material, the dielectric layer 40, and the first conductive material that are higher than the top surfaces of the through holes 12 are removed through etching, the entire sidewall of each formed lower electrode pillar 20 is covered by the dielectric layer 40.

In an embodiment, an isolation structure 14 is formed between the contact pads 11 on the substrate 10. After the initial lower electrode pillars are formed, the dielectric layer 40 is deposited, wherein the dielectric layer 40 covers the initial lower electrode pillars and the isolation structure 14. A second conductive material is deposited above the dielectric layer 40, wherein a top surface of the second conductive material is higher than a top surface of the dielectric layer 40. Portions of the second conductive material, the dielectric layer 40, and the first conductive material that are higher than the bottom surface of the second support layer 32 and the second support layer 32 are removed, to form the lower electrode pillars 20. That is, a part of the first conductive material in each through hole 12 is also removed. Regardless of whether or not the second support layer 32 is retained before this step, the upper portions of the lower electrode pillars 20 are directly covered by the dielectric layer 40 after this etching step.

In an embodiment, the method of manufacturing a semiconductor structure further includes: forming a second upper electrode 52 above the first support layer 31 and a peripheral region of the first upper electrode 51 which is not covered by the first support layer 31, wherein the second upper electrode 52 is electrically connected to the first upper electrode 51 to form an upper electrode 50.

In an embodiment, the removing a part of the first initial support layer to form the first support layer 31 includes: forming a second mask layer above the first initial support layer 311, wherein the second mask layer at least exposes a part of the first upper electrode 51; etching the first initial support layer 311 by using the second mask layer as a mask, and forming the first support layer 31 that exposes a peripheral region of a part of the first upper electrode 51, so that the subsequently formed second upper electrode 52 is electrically connected to the first upper electrode 51 to form the upper electrode 50.

In an embodiment, the method of manufacturing a semiconductor structure further includes: removing the sacrificial layer 13; forming a dielectric layer 40 on surfaces of the lower electrode pillars 20; forming a first upper electrode 51 on a surface of the dielectric layer 40; forming a second upper electrode 52 on the first upper electrode 51, wherein the first upper electrode 51 and the second upper electrode 52 are used as an upper electrode 50. The first support layer 31 is formed between the first upper electrode 51 and the second upper electrode 52, and the second upper electrode 52 covers the first support layer 31. The dielectric layer 40 isolates the lower electrode pillars 20 from the upper electrode 50. The upper electrode 50 buries the first support layer 31, so that the first support layer 31 can reliably support the plurality of lower electrode pillars 20; moreover, the first support layer 31 is located between the second upper electrode 52 of the upper electrode 50 and the lower electrode pillars 20, which can also isolate the lower electrode pillars 20 from the upper electrode 50.

It should be noted that, while the first conductive material 21 in the second support layer 32 is removed, the second support layer 32 is also removed. That is, the upper portions of the plurality of independent lower electrode pillars 20 are not covered by the second support layer 32.

It should be noted that, after the first conductive material 21 is filled in the through holes 12, patterned etching is performed, to etch gaps between the lower electrode pillars 20, and the sacrificial layer 13 is removed, so as to form holes and expose the isolation structure 14 of the substrate 10, as shown in FIG. 10 and FIG. 11. It should be noted that, as shown in FIG. 11, in this embodiment, a part of each lower electrode pillar 20 is retained above the second support layer 32; the second support layer 32 can cover the upper portion of each lower electrode pillar 20, and the second support layer 32 is covered by the first conductive material 21. In some embodiments, the lower electrode pillar 20 may not be retained above the second support layer 32. That is, during etching, the top of the second support layer 32 may be flush with the top of each lower electrode pillar 20. In an embodiment, the sacrificial layer 13 may be removed by using a wet etching process.

Figure 12:
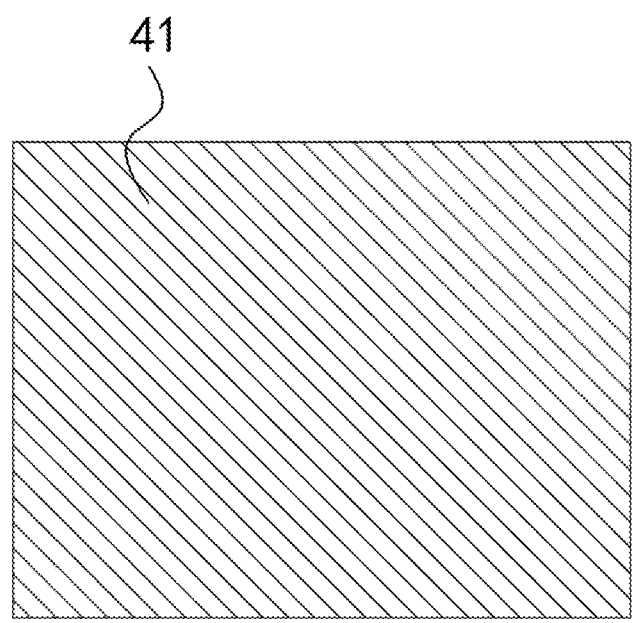
FIG. 12 is a top view of forming a dielectric layer material in a method of manufacturing a semiconductor structure according to an exemplary implementation.
Figure 13:
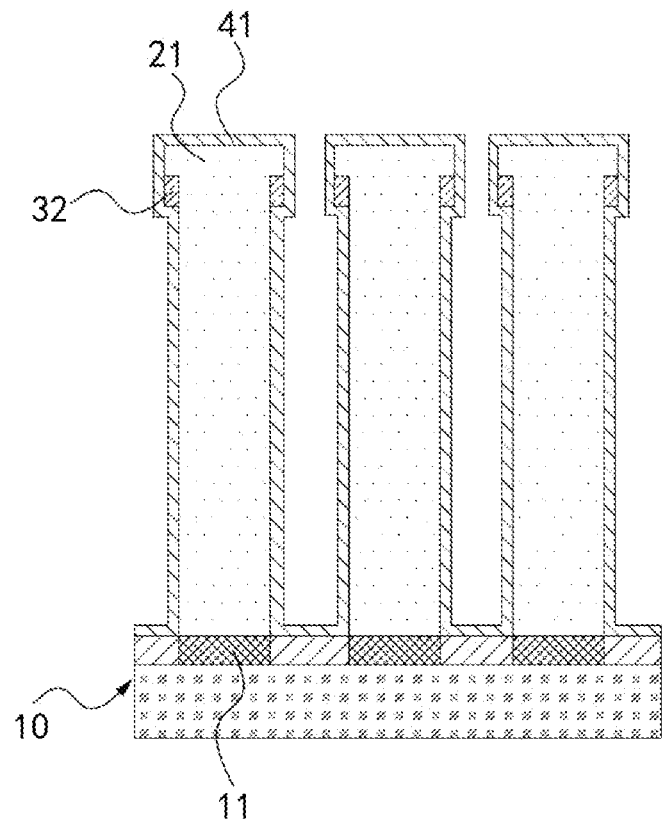
FIG. 13 is a cross-sectional schematic structural diagram of forming a dielectric layer material in a method of manufacturing a semiconductor structure according to an exemplary implementation.
Figure 14:
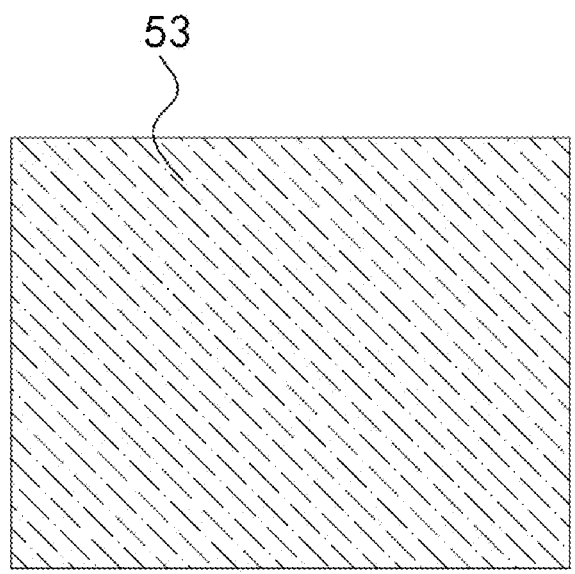
FIG. 14 is a top view of forming a first upper electrode in a method of manufacturing a semiconductor structure according to an exemplary implementation.
Figure 15:
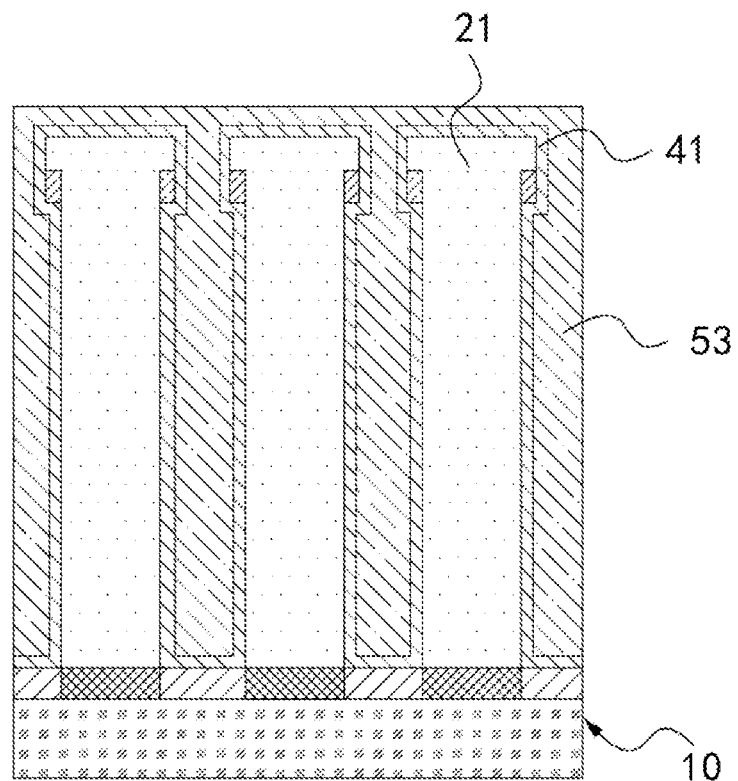
FIG. 15 is a cross-sectional schematic structural diagram of forming a first upper electrode in a method of manufacturing a semiconductor structure according to an exemplary implementation.

In an embodiment, after the sacrificial layer 13 is removed, a dielectric layer material 41 is formed on an outer surface of the first conductive material 21, and a second conductive material 53 is formed on the dielectric layer material 41. Specifically, the dielectric layer material 41 is formed. The dielectric layer material 41 covers the substrate 10, the outer surface of the first conductive material 21, and an outer surface of the second support layer 32. Moreover, the dielectric layer material 41 covers the first conductive material 21 and the second support layer 32, as shown in FIG. 12 and FIG. 13. The second conductive material 53 is formed, so that the second conductive material 53 is filled in gaps formed by the dielectric layer material 41 and covers an upper surface of the dielectric layer material 41, as shown in FIG. 14 and FIG. 15. An area of an upper surface of the second conductive material 53 may be larger than or equal to an area of the upper surface of the dielectric layer material 41.

Figure 16:
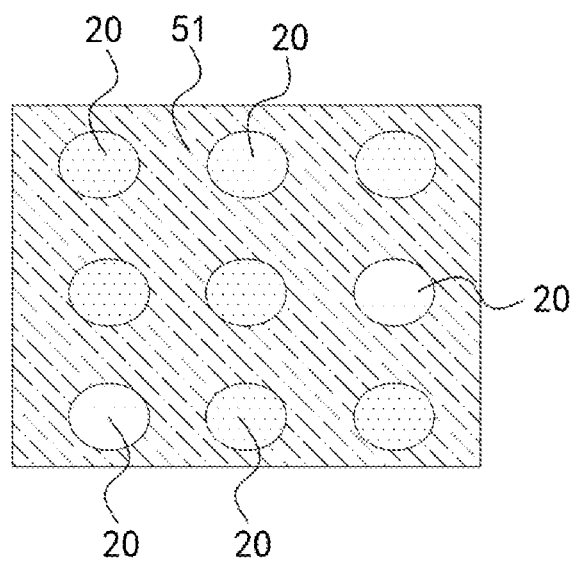
FIG. 16 is a top view of forming lower electrode pillars in a method of manufacturing a semiconductor structure according to an exemplary implementation.
Figure 17A:
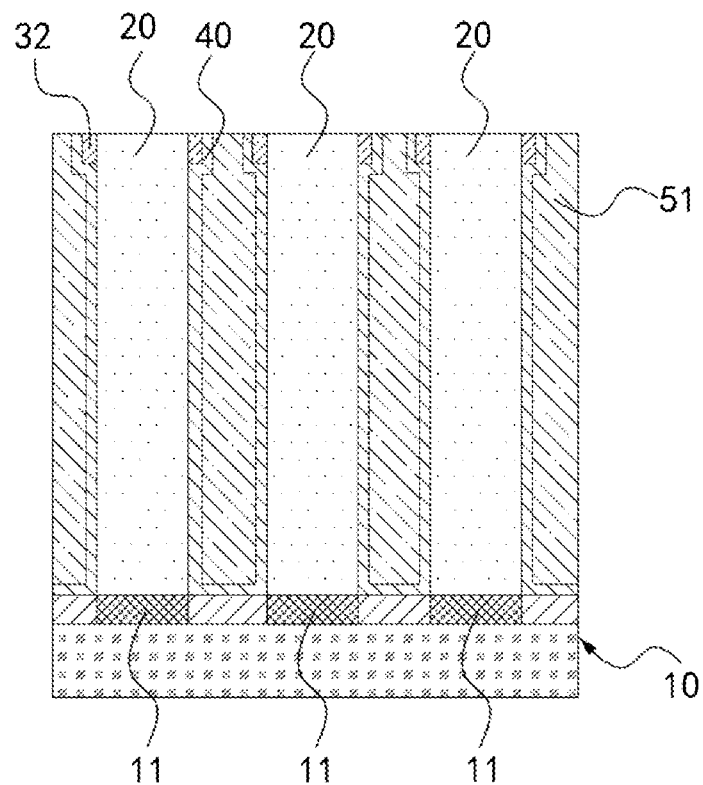
FIG. 17A is a cross-sectional schematic structural diagram of forming independent lower electrode pillars in a method of manufacturing a semiconductor structure according to an exemplary implementation.

In an embodiment, the first conductive material 21, the dielectric layer material 41, and the second conductive material 53 that are above the second support layer 32 are removed. The remaining first conductive material 21 is used as the lower electrode pillars 20, the remaining dielectric layer material 41 is used as the dielectric layer 40, and the remaining second conductive material 53 is used as the first upper electrode 51. Specifically, the dielectric layer 40 covers the second support layer 32. The first support layer 31 and the second support layer 32 are used as a support layer 30. That is, when the horizontal portion at the top of each lower electrode pillar 20 is removed, the top of the second support layer 32 is exposed and the second support layer 32 is retained. In this case, the first conductive material 21, the dielectric layer material 41, and the second conductive material 53 that are located above the second support layer 32 are removed. The plurality of lower electrode pillars 20 are independently disposed on the contact pads 11 of the substrate 10 respectively, while the second support layer 32 covers the upper portion of each lower electrode pillar 20, as shown in FIG. 16 and FIG. 17A.

Figure 17B:
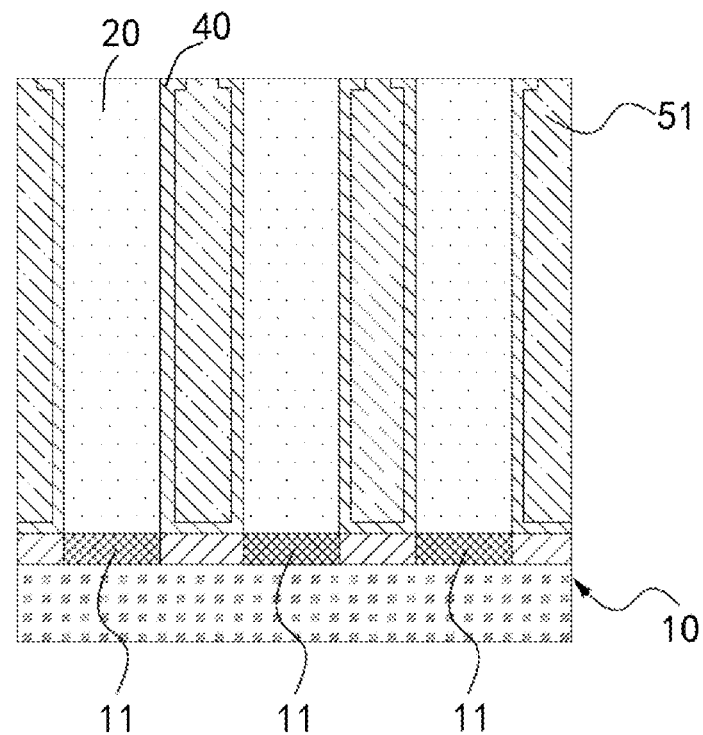
FIG. 17B is a cross-sectional schematic structural diagram of forming independent lower electrode pillars in a method of manufacturing a semiconductor structure according to another exemplary implementation.

In another embodiment, the first conductive material 21, the dielectric layer material 41, and the second conductive material 53 that are located above the bottom of the second support layer 32 are removed. The remaining first conductive material 21 is used as the lower electrode pillars 20, the remaining dielectric layer material 41 is used as the dielectric layer 40, and the remaining second conductive material 53 is used as the first upper electrode 51. Specifically, before the first support layer 31 is formed, the second support layer 32 is removed. The first support layer 31 is used as the support layer 30. That is, when the horizontal portion at the top of each lower electrode pillar 20 is removed through etching, the second support layer 32 covering the upper portion of each lower electrode pillar 20 is also removed, so that only the lower electrode pillars 20 and the dielectric layer 40 covering the surface of each lower electrode pillar 20 are retained, as shown in FIG. 17B. The second support layer 32, the first conductive material 21, the dielectric layer material 41, and the second conductive material 53 are removed together. Then, the first support layer 31 and the second upper electrode 52 are further formed. A specific process and manner are not limited herein, and reference may be made to the foregoing embodiments. In this embodiment, the laminated structure is completely removed.

In an embodiment, the method of manufacturing a semiconductor structure further includes: after forming the first support layer 31, forming a second upper electrode 52 on the first upper electrode 51, wherein the first upper electrode 51 and the second upper electrode 52 are used as an upper electrode 50. The second upper electrode 52 covers the first support layer 31.

Figure 18:
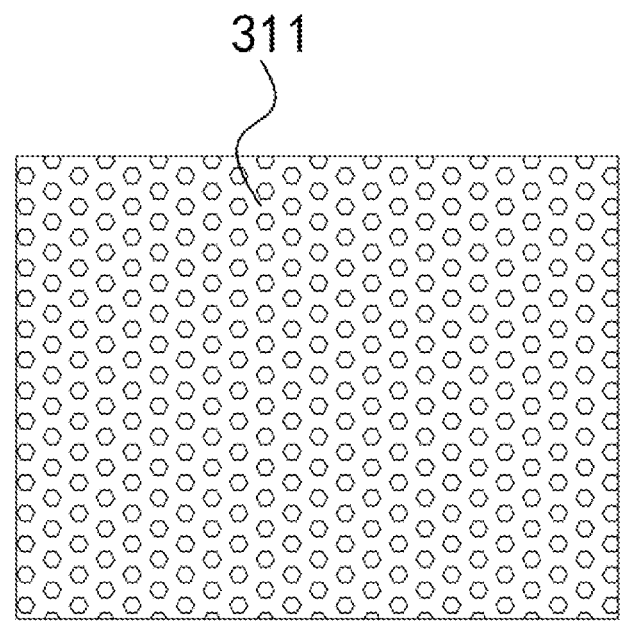
FIG. 18 is a top view of forming a main body layer section in a method of manufacturing a semiconductor structure according to an exemplary implementation.
Figure 19:
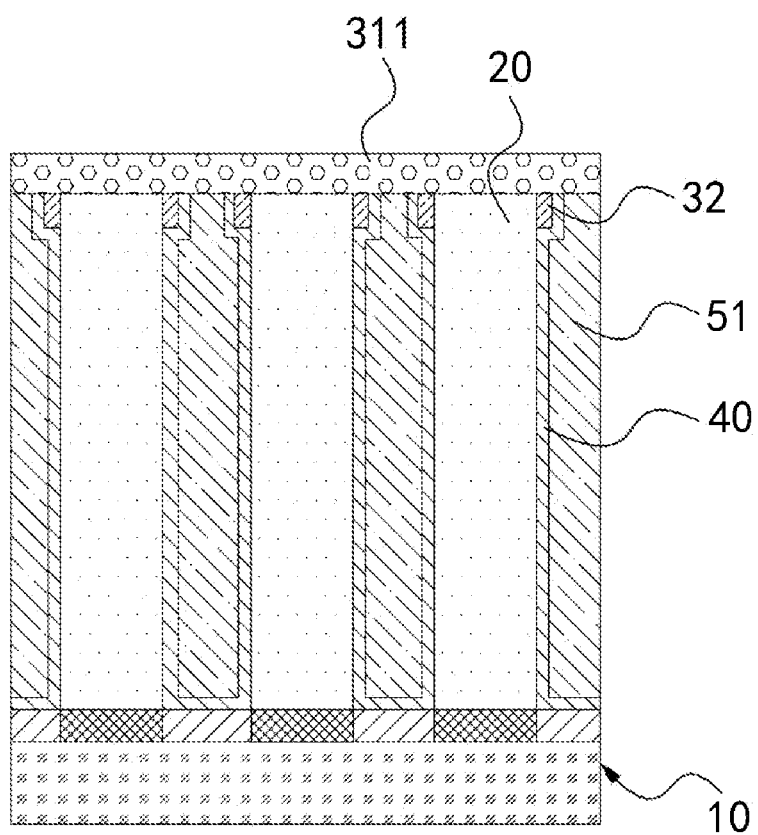
FIG. 19 is a cross-sectional schematic structural diagram of forming a main body layer section in a method of manufacturing a semiconductor structure according to an exemplary implementation.
Figure 20:
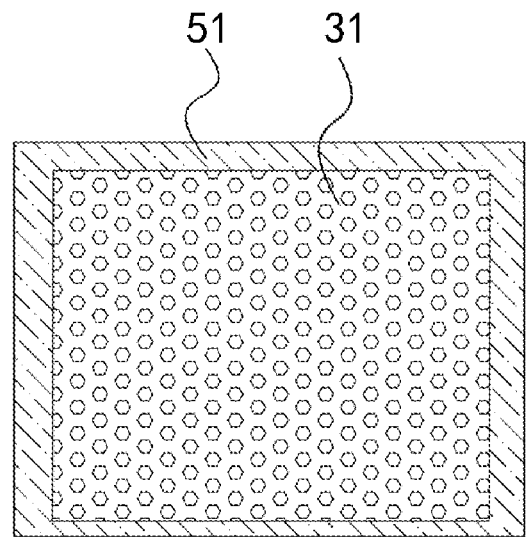
FIG. 20 is a top view of exposing a first upper electrode in a method of manufacturing a semiconductor structure according to an exemplary implementation.
Figure 21:
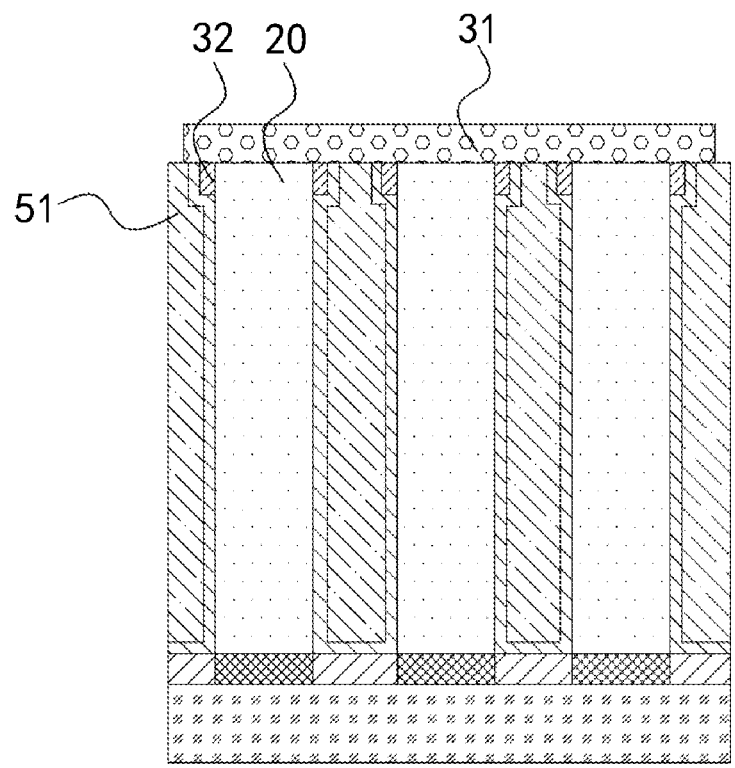
FIG. 21 is a cross-sectional schematic structural diagram of exposing a first upper electrode in a method of manufacturing a semiconductor structure according to an exemplary implementation.
Figure 22:
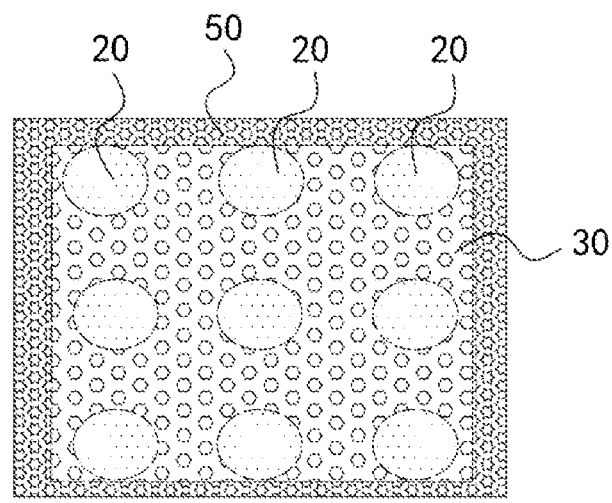
FIG. 22 is a top view of a semiconductor structure according to an exemplary implementation.
Figure 23:
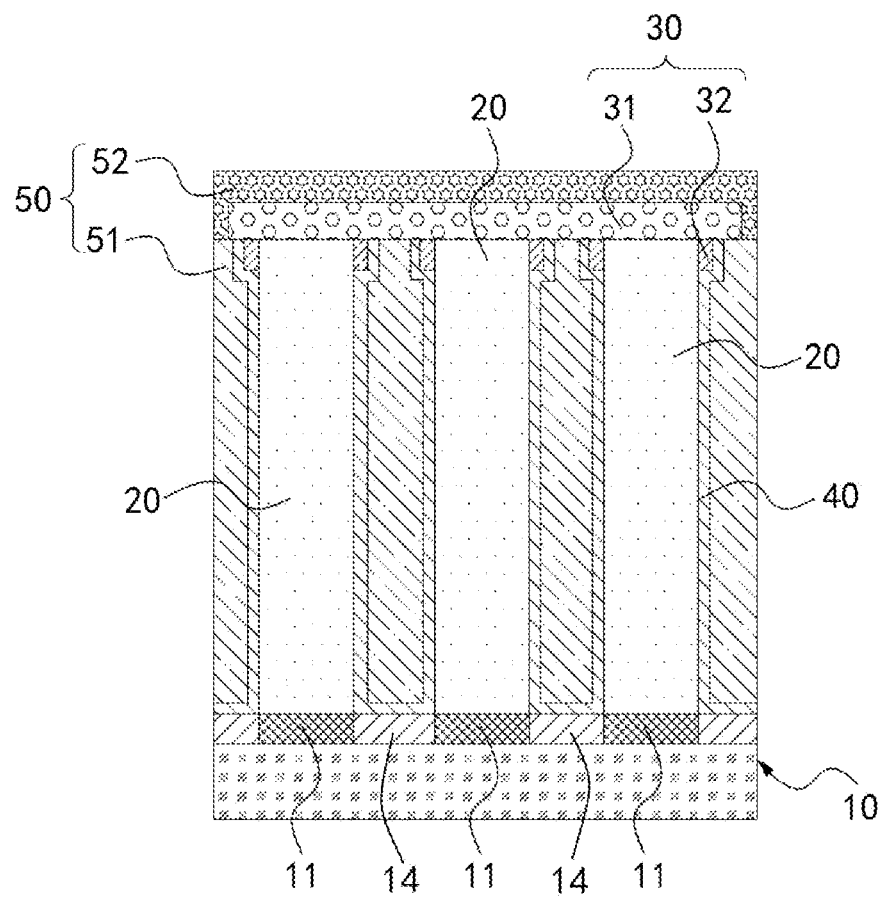
FIG. 23 is a cross-sectional schematic structural diagram of a semiconductor structure according to an exemplary implementation.

The first support layer 31 is formed, wherein the first support layer 31 covers the first upper electrode 51, the second support layer 32, and the top of each lower electrode pillar 20, as shown in FIG. 18 and FIG. 19. Patterned etching is performed, to retain the lower electrode pillars 20 and the first support layer 31 on the upper surface of the second support layer 32, and expose the first upper electrode 51 on the periphery, as shown in FIG. 20 and FIG. 21. Then, the second upper electrode 52 is formed, wherein the second upper electrode 52 covers the second support layer 32 and is connected to a peripheral region of the first upper electrode 51, as shown in FIG. 22 and FIG. 23.

It should be noted that, a material of the dielectric layer 40 includes a high-k material, which includes, but is not limited to, at least one from a group consisting of alumina, zirconia, and hafnium oxide. Materials of the first upper electrode 51 and the second upper electrode 52 of the upper electrode 50 may include one or more metal materials from a group consisting of titanium, titanium nitride, platinum, and the like, which is not limited herein. In this embodiment, a material of the upper electrode 50 includes, but is not limited to, titanium nitride. A process for forming the dielectric layer 40 and the first upper electrode 51 and second upper electrode 52 of the upper electrode 50 may be the physical vapor deposition process, chemical vapor deposition process, or atomic layer deposition process in the related art, which is not limited herein.

An embodiment of the present disclosure further provides a semiconductor structure. Referring to FIG. 22 and FIG. 23, the semiconductor structure includes: a substrate 10, including a plurality of lower electrode pillars 20 that are arranged at intervals; a dielectric layer 40, at least partially covering a sidewall of each of the lower electrode pillars 20; a first upper electrode 51, covering a surface of the dielectric layer 40; a first support layer 31, located above the plurality of lower electrode pillars 20, the dielectric layer 40, and the first upper electrode 51, wherein the first support layer 31 at least exposes a peripheral region of a part of the first upper electrode 51.

The semiconductor structure according to an embodiment of the present disclosure includes a substrate 10, a plurality of lower electrode pillars 20, a first support layer 31, a dielectric layer 40, and a first upper electrode 51. The plurality of lower electrode pillars 20 are arranged at intervals on the substrate 10. The first support layer 31 is formed on the top of each lower electrode pillar 20, and the first support layer 31 can connect the plurality of lower electrode pillars 20, the dielectric layer 40, and the first upper electrode 51, so that the first support layer 31 can support the plurality of lower electrode pillars 20 and prevent the lower electrode pillars 20 from tipping, thereby ensuring the quality of the lower electrode pillars 20 and improving the performance of the semiconductor structure.

The first support layer 31 in this embodiment is used to connect the plurality of lower electrode pillars 20 indirectly, so that the plurality of lower electrode pillars 20 form an integral structure through the first support layer 31. In this way, the substrate 10 and the first support layer 31 can reliably support the plurality of lower electrode pillars 20. The first support layer 31 may be of an integral structure, so as to connect all the lower electrode pillars 20, thereby ensuring a reliable support effect. In an embodiment, a plurality of first support layers 31 may be provided. Each first support layer 31 may connect at least two lower electrode pillars 20, which can also ensure a reliable support effect.

The dielectric layer 40 reliably isolates the lower electrode pillars 20 from the upper electrode 50. A material of the dielectric layer 40 includes a high-k material, which includes, but is not limited to, alumina, zirconia, hafnium oxide or other high-k materials, or any combination thereof.

In an embodiment, the material of the lower electrode pillars 20 may include one or more metal materials from a group consisting of titanium, titanium nitride, platinum, and the like, which is not limited herein.

In an embodiment, as shown in FIG. 23, the substrate 10 includes an isolation structure 14 located between the contact pads 11, and the dielectric layer 40 further covers an upper surface of the isolation structure 14. The lower electrode pillars 20 and the contact pads 11 may be integrally connected one to one. The lower electrode pillars 20 are in direct contact with the contact pads 11, thereby ensuring the electrical connection between the lower electrode pillars 20 and the contact pads 11.

Specifically, a material of the contact pads 11 includes, but is not limited to, tungsten (W). The plurality of lower electrode pillars 20 and the plurality of contact pads 11 may be integrally connected one to one.

The substrate 10 may include a base 15, an isolation structure 14, and contact pads 11. The contact pads 11 are located in the isolation structure 14. The base 15 include electronic devices therein, and the contact pads 11 may be connected to corresponding electronic devices respectively. The base 15 may include a portion made of a silicon-containing material. The base 15 may be made of any suitable material, including, for example, at least one from the group consisting of silicon, monocrystalline silicon, polysilicon, amorphous silicon, silicon-germanium, monocrystalline silicon-germanium, polycrystalline silicon-germanium, or carbon-doped silicon. The isolation structure 14 may include silicon nitride (SiN), silicon oxynitride (SiON), silicon carbon nitride (SiCN) or the like.

In an embodiment, the dielectric layer 40 further covers the isolation structure 14 located between the contact pads 11.

In an embodiment, as shown in FIG. 23, the first support layer 31 is located at the top of each lower electrode pillar 20, so as to connect the plurality of lower electrode pillars 20. The first support layer 31 and the substrate 10 clamp the plurality of lower electrode pillars 20, thereby reliably supporting the lower electrode pillars 20. Specifically, the support layer 30 may only include the first support layer 31. That is, the first support layer 31 directly connects the top of the plurality of lower electrode pillars 20, thereby supporting the plurality of lower electrode pillars 20. In an embodiment, the first support layer 31 may be of an integral structure, so as to connect all the lower electrode pillars 20, thereby ensuring a reliable support effect. In an embodiment, a plurality of first support layers 31 may be provided. Each first support layer 31 may connect at least two lower electrode pillars 20, which can also ensure a reliable support effect.

It should be noted that, when the support layer 30 only includes the first support layer 31, cross sections at all positions of each lower electrode pillar 20 may be the same.

In an embodiment, the upper electrode 50 may only include the first upper electrode 51, which covers the surface of the dielectric layer 40. The dielectric layer 40 is located between the lower electrode pillars 20 and the first upper electrode 51. The upper electrode 50 may only include the first upper electrode 51, and the first support layer 31 may directly cover the first upper electrode 51.

In an embodiment, as shown in FIG. 23, the semiconductor structure further includes: a second upper electrode 52, covering an upper surface of the first support layer 31 and an upper surface of a peripheral region of the first upper electrode 51 which is not covered by the first support layer 31, wherein the second upper electrode 52 is electrically connected to the first upper electrode 51.

The upper electrode 50 consists of the first upper electrode 51 and the second upper electrode 52. The second upper electrode 52 covers the first support layer 31, and the second upper electrode 52 connects peripheral regions of the first upper electrode 51.

In an embodiment, the first upper electrode 51 and the second upper electrode 52 are formed independently, to ensure that the first support layer 31 is formed between the first upper electrode 51 and the second upper electrode 52.

Materials of the first upper electrode 51 and the second upper electrode 52 of the upper electrode 50 may include one or more metal materials from a group consisting of titanium, titanium nitride, platinum, and the like, which is not limited herein.

In an embodiment, the first support layer 31 at least partially exposes the first upper electrode 51, so that the first upper electrode 51 can be used for electrical connection. For example, the first upper electrode 51 and the second upper electrode 52 are electrically connected to form the upper electrode 50.

In an embodiment, a peripheral portion of the first upper electrode 51 is at least partially located on an outer side of the first support layer 31. That is, the peripheral portion of the first upper electrode 51 is larger than a peripheral portion of the first support layer 31, so that the first support layer 31 can at least expose a part of the first upper electrode 51.

In an embodiment, as shown in FIG. 23, the semiconductor structure further includes: a second support layer 32, at least covering a partial sidewall of an upper portion of each lower electrode pillar 20, to reliably support the upper portion of each lower electrode pillar 20.

In an embodiment, as shown in FIG. 23, the first support layer 31 is connected to the first upper electrode 51, wherein the second support layer 32 is connected to the first support layer 31. The support layer 30 includes the first support layer 31 and the second support layer 32; the second support layer 32 is located under the first support layer 31 and covers the sidewall of the upper portion of each lower electrode pillar 20. The support layer 30 consists of the first support layer 31 and the second support layer 32. The second support layer 32 covers each lower electrode pillar 20, and the first support layer 31 connects the plurality of lower electrode pillars 20, so that the support layer 30 is more is stably connected to each lower electrode pillar 20, thereby ensuring reliable support for the plurality of lower electrode pillars 20 and prevent the lower electrode pillars 20 from tipping.

It should be noted that, respective second support layers 32 covering the peripheries of the lower electrode pillars 20 (herein, each lower electrode pillar 20 corresponds to an independent second support layer 32; the second support layer 32 on the plurality of lower electrode pillars 20 may be of an integral structure in practice) may have the same structure, and the plurality of second support layers 32 each may be a circumferentially closed structure, i.e., forming a closed ring structure to completely cover the upper portion of the lower electrode pillar 20; alternatively, at least one of a plurality of second support layers 32 may be a non-circumferentially-closed structure, to implement partial wrapping for the upper portion of the corresponding lower electrode pillar 20. In some embodiments, all the second support layers 32 may be circumferentially closed structures, or all the second support layers 32 may be non-circumferentially-closed structures, which is not limited herein.

It should be noted that, when the support layer 30 includes the first support layer 31 and the second support layer 32, the second support layer 32 and the dielectric layer 40 jointly cover the sidewall of each lower electrode pillar 20. When the support layer 30 only includes the first support layer 31, the dielectric layer 40 covers the sidewall of each lower electrode pillar 20.

An area of the cross section of the upper portion of the lower electrode pillar 20 may be larger than an area of the cross section of the lower portion of the lower electrode pillar 20, so that the second support layer 32 can cover the sidewall of the upper portion of the lower electrode pillar 20. The lower electrode pillar 20 is a structure with a large top and small a bottom. The second support layer 32 covers the larger upper portion of the lower electrode pillar 20.

In an embodiment, the first support layer 31 and the second support layer 32 are formed independently, ensuring a simpler manufacturing process of the semiconductor structure and helping to form a more reliable structure of the support layer 30.

In an embodiment, the first support layer 31 includes one or more from a group is consisting of silicon nitride, silicon oxynitride or silicon carbonitride; the second support layer 32 includes one or more from a group consisting of silicon nitride, silicon nitride oxide or silicon carbonitride. The first support layer 31 and the second support layer 32 may be made of a same material, to ensure a reliable connection between the first support layer 31 and the second support layer 32, which helps improve the support for the lower electrode pillars 20. In some embodiments, it is also possible that the first support layer 31 and the second support layer 32 are made of different materials. The first support layer 31 and the second support layer 32 may be made of similar materials, which can also ensure a reliable connection between the first support layer 31 and the second support layer 32.

In an embodiment, a total area of the cross section of the upper portion of the lower electrode pillar 20 and the cross section of the second support layer 32 is larger than an area of the cross section of the lower portion of the lower electrode pillar 20.

It should be noted that the semiconductor structure in the embodiment is obtained through the method of manufacturing a semiconductor structure. For other materials and structures of the semiconductor structure in the embodiment, reference may be made to the method of manufacturing a semiconductor structure.

The semiconductor structure in the embodiments of the present disclosure is a column capacitor structure. By forming a support layer on the top of each lower electrode pillar, the lower electrode pillars can be supported and prevented from tipping, so that the lower electrode pillars can be relatively high to meet storage requirements. Further, the support layer can only include the first support layer disposed on the top of each lower electrode pillar, to connect the plurality of lower electrode pillars, so that the support layer and the substrate jointly provide reliable support for the lower electrode pillars. Alternatively, the support layer may include the first support layer disposed on the top of each lower electrode pillar and the second support layer covering the upper portion of each lower electrode pillar. The second support layer and the first support layer form a grid-like structure, to implement reliable connection with the lower electrode pillars, thereby ensuring reliable support for the lower electrode pillars and preventing the lower electrode pillars from tipping, and further increasing the height of each lower electrode pillar to meet the storage requirements.

Those skilled in the art may easily figure out other implementations of the present disclosure after considering the specification and practicing the application disclosed herein. The present disclosure is intended to cover any variations, purposes, or applicable changes of the present disclosure. Such variations, purposes or applicable changes follow the general principle of the present disclosure and include common knowledge or conventional technical means in the technical field which is not disclosed in the present disclosure. The specification and implementations are merely considered as illustrative, and the real scope and spirit of the present disclosure are directed by the appended claims.

It should be noted that, the present disclosure is not limited to the precise structures described above and shown in the drawings, and can be modified and changed in many ways without departing from the scope of the present disclosure. The scope of the present disclosure is defined by the appended claims.

The invention claimed is:

1. A semiconductor structure, comprising:
    a substrate, comprising a plurality of lower electrode pillars arranged at intervals;
    a dielectric layer, at least partially covering a sidewall of each of the lower electrode pillars;
    a first upper electrode, covering a surface of the dielectric layer;
    a first support layer, located above the plurality of lower electrode pillars, the dielectric layer, and the first upper electrode, wherein the first support layer at least exposes a peripheral region of a part of the first upper electrode; and
    a second support layer, at least covering a partial sidewall of an upper portion of each of the lower electrode pillars;
    wherein the first support layer is connected to the first upper electrode, and the second support layer is connected to the first support layer.

2. The semiconductor structure according to claim 1, further comprising:
    a second upper electrode, covering an upper surface of the first support layer and an upper surface of the peripheral region of the first upper electrode which is not covered by the first support layer;
    wherein the second upper electrode is electrically connected to the first upper electrode.

3. The semiconductor structure according to claim 1, wherein the first support layer at least exposes a part of the first upper electrode.

4. The semiconductor structure according to claim 1, wherein a periphery of the first upper electrode is at least partially located on an outer side of the first support layer.

5. The semiconductor structure according to claim 1, further comprising a plurality of contact pads arranged at intervals, wherein the lower electrode pillars and the contact pads may be integrally connected one to one.

6. The semiconductor structure according to claim 5, wherein the substrate comprises an isolation structure between the contact pads, and the dielectric layer further covers an upper surface of the isolation structure.

7. A method of manufacturing a semiconductor structure, comprising:
    providing a substrate, and forming a plurality of lower electrode pillars arranged at intervals on the substrate;
    forming a dielectric layer and a first upper electrode among the plurality of lower electrode pillars, wherein the dielectric layer at least partially covers a sidewall of each of the lower electrode pillars, and the first upper electrode covers a surface of the dielectric layer; and
    forming a first initial support layer above the plurality of lower electrode pillars, the dielectric layer, and the first upper electrode, and removing a part of the first initial support layer to form a first support layer;
    wherein the first support layer at least exposes a peripheral region of a part of the first upper electrode.

8. The method of manufacturing a semiconductor structure according to claim 7, wherein the forming a plurality of lower electrode pillars arranged at intervals on the substrate comprises:
    forming a laminated structure on the substrate;
    forming a plurality of through holes in the laminated structure, wherein the through holes penetrate the laminated structure to expose a surface of the substrate;
    filling a first conductive material in the through holes to form initial lower electrode pillars, removing the laminated structure, and forming an initial dielectric layer and a first initial upper electrode on upper surfaces of the initial lower electrode pillars; and
    removing a part of each of the initial lower electrode pillars, a part of the initial dielectric layer, and a part of the first initial upper electrode, and forming the lower electrode pillars, the dielectric layer, and the first upper electrode whose top portions are flush with each other.

9. The method of manufacturing a semiconductor structure according to claim 8, wherein the forming a plurality of through holes in the laminated structure comprises:
    the laminated structure comprising a sacrificial layer and a second initial support layer stacked in turn;
    forming a mask layer with a mask pattern on the laminated structure, wherein the mask pattern at least exposes a part of the second initial support layer;
    removing the sacrificial layer and a part of the second initial support layer by using the mask pattern, to expose a partial sidewall of each of the lower electrode pillars and a partial surface of the substrate; and
    forming the plurality of through holes penetrating the laminated structure.

10. The method of manufacturing a semiconductor structure according to claim 9, wherein a remaining part of second initial support layer forms a second support layer on a partial sidewall of an upper portion of each of the initial lower electrode pillars.

11. The method of manufacturing a semiconductor structure according to claim 10, wherein a total area of a cross section of the upper portion of the initial lower electrode pillar and a cross section of the second support layer is larger than an area of a cross section of a lower portion of the initial lower electrode pillar.

12. The method of manufacturing a semiconductor structure according to claim 11, wherein the removing a part of each of the initial lower electrode pillars, a part of the initial dielectric layer, and a part of the first initial upper electrode are removed, and forming the lower electrode pillars, the dielectric layer, and the first upper electrode whose top portions are flush with each other comprises:
    removing each of the initial lower electrode pillars, the initial dielectric layer, and the first initial upper electrode that are higher than the second support layer, and forming the lower electrode pillars, the dielectric layer, and the first upper electrode whose top portions are flush with each other.

13. The method of manufacturing a semiconductor structure according to claim 7, further comprising:
    forming a second upper electrode above the first support layer and the peripheral region of the first upper electrode which is not covered by the first support layer, wherein the second upper electrode is electrically connected to the first upper electrode.

14. The method of manufacturing a semiconductor structure according to claim 7, further comprising:
forming a plurality of contact pads arranged at intervals on the substrate, wherein the lower electrode pillars and the contact pads may be integrally connected one to one; and forming an isolation structure between the plurality of contact pads, wherein the dielectric layer further covers an upper surface of the isolation structure.

15. The method of manufacturing a semiconductor structure according to claim 7, wherein the removing a part of the first initial support layer to form a first support layer comprises:
forming a second mask layer above the first initial support layer, wherein the second mask layer at least exposes a part of the first upper electrode; etching the first initial support layer by using the second mask layer as a mask, and forming the first support layer that exposes a peripheral region of a part of the first upper electrode.

* * * * *